(12) United States Patent
Song et al.

(10) Patent No.: US 8,482,308 B2
(45) Date of Patent: Jul. 9, 2013

(54) CONNECTING UNIT TO TEST SEMICONDUCTOR CHIPS AND APPARATUS TO TEST SEMICONDUCTOR CHIPS HAVING THE SAME

(75) Inventors: Ki-Jae Song, Paju-si (KR); Hun-Kyo Seo, Asan-si (KR); Jae-Il Lee, Yongin-si (KR); Jong-Won Han, Cheonan-si (KR); Jong-Pil Park, Asan-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 677 days.

(21) Appl. No.: 12/614,504

(22) Filed: Nov. 9, 2009

(65) Prior Publication Data

US 2010/0117670 A1    May 13, 2010

(30) Foreign Application Priority Data

Nov. 7, 2008   (KR) .................. 10-2008-0110594

(51) Int. Cl.
*G01R 31/00*   (2006.01)
*G01R 31/28*   (2006.01)
(52) U.S. Cl.
CPC ................. *G01R 31/2886* (2013.01)
USPC .................................... 324/756.05

(58) Field of Classification Search
None
See application file for complete search history.

(56) References Cited

U.S. PATENT DOCUMENTS 6,242,932 B1 *   6/2001   Hembree ................ 324/756.02

FOREIGN PATENT DOCUMENTS

| JP | 10-227830 | 8/1998 |
| JP | 11-030644 | 2/1999 |
| KR | 2007-16193 | 2/2007 |
| KR | 2007-95073 | 9/2007 |

* cited by examiner

*Primary Examiner* — Paresh Patel
(74) *Attorney, Agent, or Firm* — Stanzione & Kim, LLP

(57) ABSTRACT

A connecting unit to test a semiconductor chip and an apparatus to test the semiconductor chip having the same include a plurality of connectors, on which a semiconductor chip having a certain pattern of electrical connection terminals, having a plurality of holes, cables configured to electrically connect the electrical connection terminals to the exterior, and coupling units configured to selectively electrically connect the cables to the electrical connection terminals through the holes. Therefore, it is possible to perform electrical tests of semiconductor chips having various patterns of electrical connection terminals and receive the semiconductor chips in a tray at a time.

13 Claims, 5 Drawing Sheets

CONNECTING UNIT TO TEST SEMICONDUCTOR CHIPS AND APPARATUS TO TEST SEMICONDUCTOR CHIPS HAVING THE SAME

CROSS-REFERENCE TO RELATED APPLICATIONS

This application claims priority under 35 U.S.C. §119 from Korean Patent Application No. 10-2008-0110594, filed on Nov. 7, 2008, the contents of which are hereby incorporated herein by reference in its entirety.

BACKGROUND

1. Field of the General Inventive Concept

Example embodiments relate to an apparatus to test semiconductor chips. Other example embodiments relate to a connecting unit to test semiconductor chips and an apparatus to test semiconductor chips having the same to perform electrical tests on semiconductor chips having various patterns of electrical connection terminals and receive the semiconductor chips in a tray simultaneously.

2. Description of the Related Art

In general, semiconductor chips are manufactured by sequentially or selectively performing a plurality of unit processes such as deposition, diffusion, exposure, ion implantation, etc., on a wafer.

Each of the semiconductor chips manufactured as described above generally has a plurality of balls, which are disposed at predetermined pitches.

In addition, the number of the balls formed on the semiconductor chip may differ depending on the kind of the semiconductor chip, and the pitch of the balls may also differ.

The semiconductor chips manufactured as described above undergo an electrical test process by a test apparatus.

Here, contact terminals, i.e., electrical contacts such as the balls of the semiconductor chips, are electrically connected to the test apparatus.

Therefore, the test apparatus may perform the electrical tests on the semiconductor chips.

More specifically, a conventional cable configured to electrically connect the test apparatus to a connector is provided.

The connector is coupled to a printed circuit board on which a certain pattern is formed. The printed circuit board includes a socket.

The socket fixes the semiconductor chip having contact terminals on which certain patterns are formed.

As described above, in the conventional art, the printed circuit board must be configured to connect the test apparatus to the semiconductor chips.

The printed circuit board is manufactured through a series of processes to correspond to patterns of the contact terminals of the semiconductor chips to be tested. Therefore, since the printed circuit board has a pattern corresponding to the pattern of the contact terminals of the semiconductor chips, the pattern of the printed circuit board is electrically connected to the contact terminals of the semiconductor chips.

As a result, the semiconductor chip may be electrically connected to the test apparatus through the printed circuit board so that the electrical test can be performed.

However, the semiconductor chips have various patterns of the contact terminals.

In addition, the pattern formed on the printed circuit board cannot be modified after a manufacturing process thereof.

Therefore, in the conventional art, the printed circuit board having the pattern corresponding to the pattern of the various contact terminals must be re-manufactured.

That is, in the conventional art, in order to perform the electrical test depending on the semiconductor chips to be tested, separate printed circuit boards must be prepared.

SUMMARY

Example embodiments may provide a connecting unit to test semiconductor chips and an apparatus to test semiconductor chips having the same to perform tests by selectively connecting cables to electrical connection terminals to correspond to a pattern of various electrical connection terminals of semiconductor chips in which electrical tests are performed.

Additional aspects and utilities of the present general inventive concept will be set forth in part in the description which follows and, in part, will be obvious from the description, or may be learned by practice of the general inventive concept.

Example embodiments may also provide a connecting unit to test semiconductor chips and an apparatus to test semiconductor chips having the same that are capable of simultaneously receiving the electrically tested semiconductor chips in a tray.

Example embodiments are directed to a connecting unit to test a semiconductor chip.

Embodiments of the present general inventive concept may be achieved by providing a plurality of connectors having a plurality of holes, and on which a semiconductor chip having a certain pattern of electrical connection terminals is mounted, cables configured to electrically connect the electrical connection terminals to an exterior of the connecting unit, and coupling units configured to selectively electrically connect the cables to the electrical connection terminals through the plurality holes.

Each of the coupling units may include, a conductive protrusion disposed in one of the plurality of holes, a support body connected to the conductive protrusion, extending from a periphery of the hole by a certain length, a pair of curved bodies configured to extend by a certain length from inside the support body to face each other, and a pair of hook bodies installed at a first end of the cable, inserted between the pair of curved bodies, and bent in a hook shape to be hooked inside the pair of curved bodies.

In addition, a hinge unit may be further installed adjacent the first end of each cable to rotatably couple the pair of hook bodies to each cable, and a mounting groove disposed at the first end of each cable in which the pair of hook bodies are inserted and mounted.

Further, a plurality of socket components may be installed on one surface of each connector to fix the semiconductor chip and mount the semiconductor chip on the one surface of each connector.

The support body may include two symmetric portions disposed between the pair of curved bodies and the conductive protrusion. The two symmetric portions may form a V-shaped support body.

Embodiments of the present general inventive concept may also be achieved by providing an apparatus to test a semiconductor chip which may include a tray having a plurality of receiving grooves, a connecting unit disposed over the tray and configured to selectively electrically connect electrical connection terminals formed on a plurality of semiconductor chips to an exterior of the connecting unit depending on a pattern of the electrical connection terminals disposed to correspond to positions of the receiving grooves, a tester electrically connected to the connecting unit and configured to receive an electrical signal from the semiconductor chips to perform at least one electrical test, a lifter configured to raise the tray to receive the semiconductor chips in the receiving grooves, a loader/unloader disposed adjacent to the tray and configured to load the tray onto the lifter or unload the tray, in which the semiconductor chips are received, to a position spaced apart a certain distance from the lifter, and a controller electrically connected to the tester, the lifter and the loader/unloader, configured to receive the electrical test result from the tester, and configured to unload the tray to a normal position using the loader/unloader when the electrical test result is higher than a predetermined reference level and unload the tray to an abnormal position using the loader/unloader when the electrical test result is lower than the predetermined reference level.

In example embodiments, the connecting unit may include, a connector fixing plate, a plurality of connectors installed at a plurality of positions of the connector fixing plate to expose upper and lower parts thereof to an exterior of the connecting unit, having a plurality of holes formed therein, and on which a semiconductor chip having a certain pattern of electrical connection terminals is mounted, cables configured to electrically connect the electrical connection terminals to the exterior and coupling units configured to selectively connect the cables to the electrical connection terminals through the plurality of holes.

In addition, each of the coupling units may include, a conductive protrusion disposed in one of the plurality of holes, a support body connected to the conductive protrusion, extending from a periphery of the hole by a certain length and including a plurality of symmetric portions spaced apart from each other, a pair of curved bodies configured to extend by a certain length from inside the support body to face each other, and a pair of hook bodies installed at a first end of the cable, inserted between the pair of curved bodies, and bent in a hook shape to be hooked inside the pair of curved bodies.

In addition, a hinge unit may be further installed adjacent the first end of each cable to rotatably couple the pair of hook bodies to each cable, and a mounting groove disposed at the first end of each cable in which the pair of hook bodies may be inserted and mounted.

Further, a plurality of socket components may be installed on one surface of each connector to fix the semiconductor chip and mount the semiconductor chip on the one surface of each connector.

Embodiments of the present general inventive concept may also be achieved by connecting a plurality of cables and coupling units having a plurality of hook bodies to a plurality of contact terminals of a semiconductor chip, determining a specified number or pattern of the contact terminals to test, and sending test signals through the cables and the contact terminals to the semiconductor chip and receiving test responses from the semiconductor chip through the contact terminals and cables to a tester.

At least one cable may be disconnected from the coupling units to result in the tested pattern of contact terminals.

A pair of hook bodies may be removed from the coupling units without separating the cables from the connectors. The hook bodies may be removed from the coupling units by rotating the hook bodies about a hinge unit. The hook bodies may also be removed to a mounting groove in the cable.

Embodiments of the present general inventive concept may also be achieved by mounting a semiconductor chip to a connecting unit, connecting a tester to the semiconductor chip via the connecting unit and a plurality of cables, controlling the tester to test the semiconductor chip and obtain test results, receiving the test results and moving the semiconductor chip to one of a plurality of different positions based on a comparison of the test results to a predetermined reference level.

The plurality of cables may be connected to a plurality of contact terminals of the semiconductor chip.

A plurality of cables relating to untested contact terminals of the semiconductor chip may be disconnected.

An electrical connection between a selected number of cables and the semiconductor chip may be disconnected without disconnecting the cables.

Embodiments of the present general inventive concept may also be achieved by providing a connector fixing plate with at least one installation hole, the connector fixing plate having a first side and a second side, at least one connector disposed on both the first side and the second side of the connector fixing plate, a semiconductor chip having at least one contact terminal connected to the connector the first side of the connector fixing plate, a plurality of cables connected to the connector on the second side of the connector fixing plate, and a tester connected to the plurality of cables to send at least one electrical signal to the at least one contact terminal to obtain test results regarding the semiconductor chip.

The apparatus may also include a tray to receive the semiconductor chip, a lifter to raise the tray to receive the semiconductor chip, a loader/unloader disposed adjacent to the lifter; and a controller to control the tester, lifter and loader to test the semiconductor chip, compare the test results with a predetermined reference level and to move the semiconductor chip to one of a plurality of positions based on the compared test results.

The apparatus may also include coupling unit disposed between the plurality of cables and the at least one contact terminal to electrically connect the tester to the semiconductor chip.

The controller may control connection and disconnection of the plurality of coupling units to the plurality of cables.

The coupling unit may include a conductive protrusion to directly connect to the at least one contact terminal, a support body adjacent the conductive protrusion, a plurality of curved bodies formed adjacent the support body and having a plurality of hook bodies disposed therein and electrically connected thereto, wherein the coupling unit electrically connects at least one cable to the semiconductor chip.

BRIEF DESCRIPTION OF THE DRAWINGS

Example embodiments are described in further detail below with reference to the accompanying drawings. It should be understood that various aspects of the drawings may have been exaggerated for clarity.

The above and/or other features and utilities of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
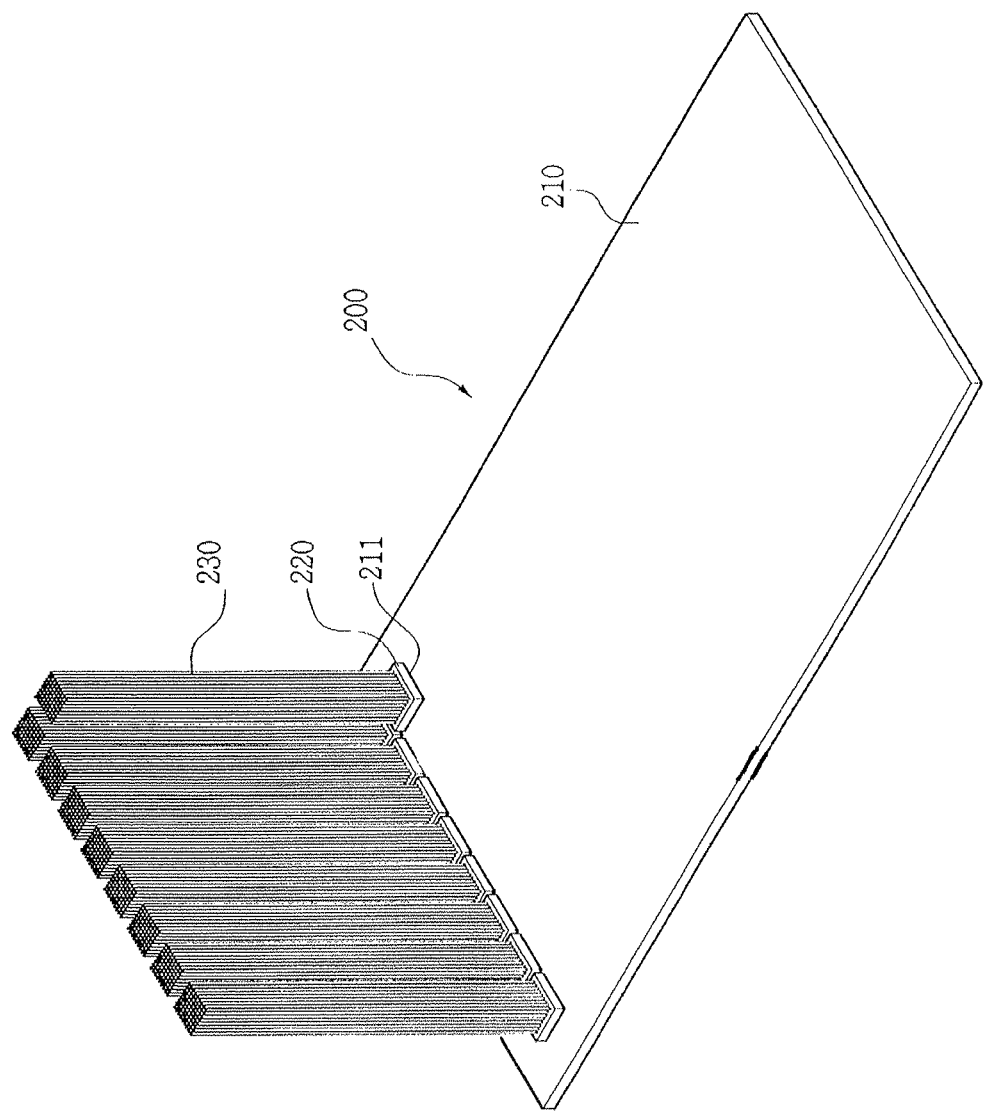
FIG. 1 is a perspective view illustrating a connecting unit to test a semiconductor chip in accordance with an example embodiment of the present general inventive concept.

Various example embodiments will now be described more fully with reference to the accompanying drawings in which some example embodiments are illustrated, wherein like reference numerals refer to the like elements throughout. The embodiments are described below in order to explain the present general inventive concept by referring to the figures. In the drawings, the thicknesses of layers and regions may be exaggerated for clarity.

Detailed illustrative embodiments are disclosed herein. However, specific structural and functional details disclosed herein are merely representative for purposes of describing example embodiments. The present general inventive concept, however, may be embodied in many alternate forms and should not be construed as limited to only example embodiments set forth herein.

Accordingly, while example embodiments are capable of various modifications and alternative forms, embodiments thereof are illustrated by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the present general inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures illustrated in succession may in fact be executed substantially concurrently or may sometimes be executed in the reverse order, depending upon the functionality/acts involved.

In order to more specifically describe example embodiments, various aspects will be described in detail with reference to the attached drawings. However, the present general inventive concept is not limited to example embodiments described.

Figure 2:
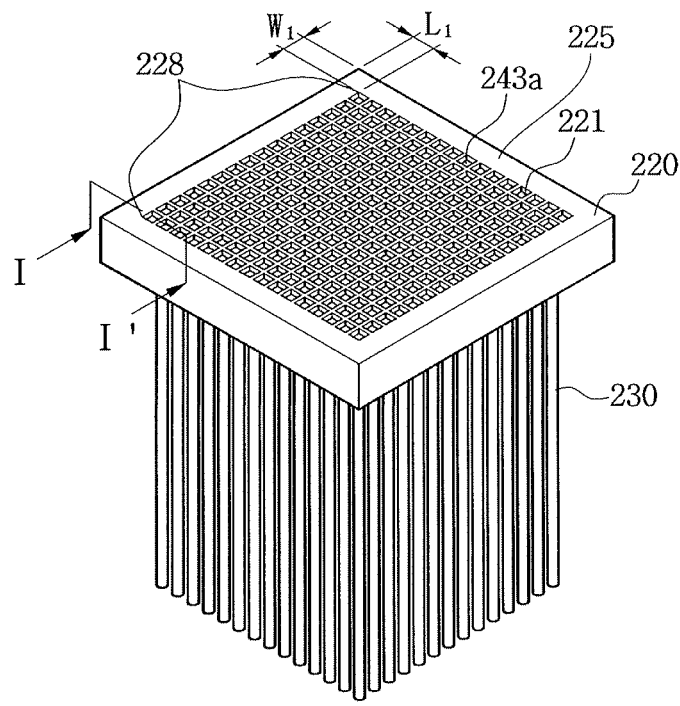
FIG. 2 is a perspective view illustrating an individual connecting unit in which connectors and cables are coupled to each other in the present general inventive concept.
Figure 3:
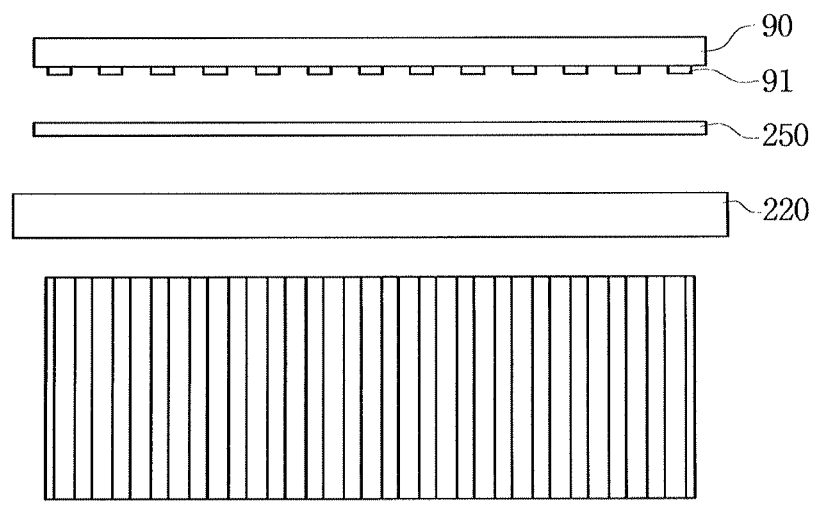
FIG. 3 is a side view illustrating a coupling relationship of a connecting unit to test a semiconductor chip in accordance with an example embodiment of the present general inventive concept.
Figure 4:
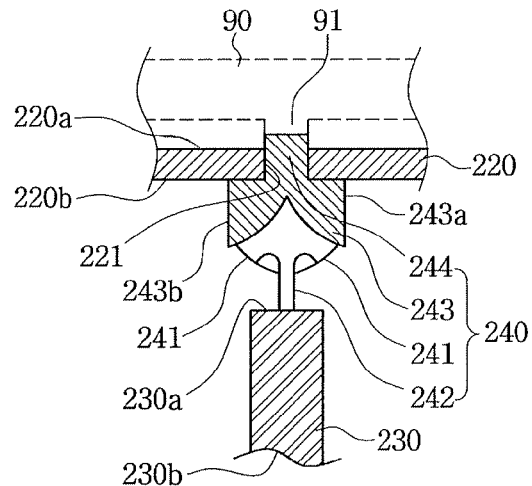
FIG. 4 is a cross-sectional view taken along line I-I' of FIG. 2.
Figure 5:
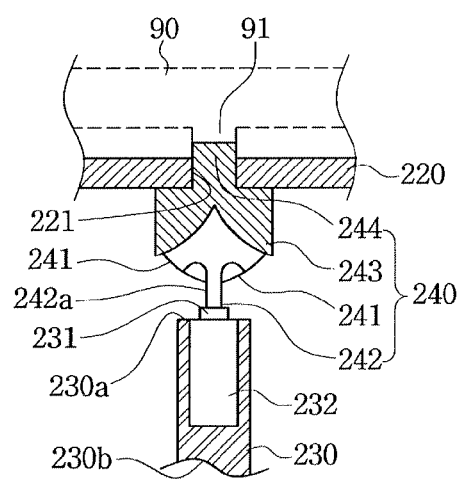
FIG. 5 is a cross-sectional view illustrating a coupling unit of FIG. 2, in which a hinge unit and a mounting groove are further formed.
Figure 6:
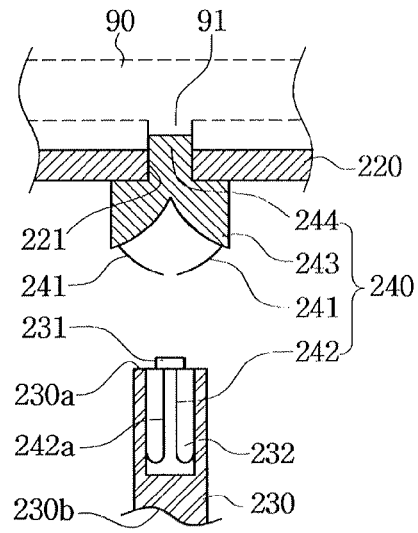
FIG. 6 is a cross-sectional view illustrating rotation of a second hook body of FIG. 5.

FIG. 1 is a perspective view illustrating a connecting unit to test a semiconductor chip in accordance with an example embodiment, FIG. 2 is a perspective view illustrating an individual connecting unit in which connectors and cables are coupled to each other, FIG. 3 is a side view illustrating a coupling relationship of a connecting unit to test semiconductor chips in accordance with an example embodiment, FIG. 4 is a cross-sectional view taken along line I-I' of FIG. 2, FIG. 5 is a cross-sectional view illustrating a coupling unit of FIG. 2, in which a hinge unit and a mounting groove are further formed, and FIG. 6 is a cross-sectional view illustrating rotation of a second hook body of FIG. 5A.

A connecting unit 200 to test a variety of different sizes and types of semiconductor chips in accordance with the inventive concept will be described with reference to FIGS. 1 to 6.

Referring to FIG. 1, the connecting unit 200 to test semiconductor chips in accordance with the present general inventive concept can include a connector fixing plate 210 having a certain thickness and a certain area of installation region. The installation region may be formed toward a lengthwise or widthwise edge of the connector fixing plate 210, and may also be formed toward a center area of the connector fixing plate.

The connector fixing plate 210 may have a plurality of installation holes 211 formed therein. The installation holes 211 can be disposed in the connector fixing plate 210 to form a lattice, or grid pattern. The installation holes 211 may be rectangular holes of various dimensions to receive connectors 220 of various shapes.

The connectors 220 may be fixed in or to, or coupled with the installation holes 211. Each of the connectors 220 may have a plurality of holes 221 (illustrated in FIG. 2). The connectors may be formed of various sizes to accommodate different amounts of cables 230 depending upon different test configurations and semiconductor chip sizes. In addition, upper 220a and lower 220b portions of the connectors 220 may be exposed to the exterior on either or both sides of the connector fixing plate 210. Also, either the upper 220a or lower 220b portion of the connectors 220 may lay flush with a surface of the connector fixing plate 210 (illustrated in FIG. 7). Therefore, by fixing or coupling the connectors 220 to the installation holes 211, the plurality of connectors 220 can be disposed on the connector fixing plate 200 in a lattice, or grid configuration.

The plurality of holes 221 of the connectors 220 may be surrounded by a border 225 having a predetermined length L1 and a predetermined width W1. L1 and W1 may be different dimensions to create a hole pattern 228 of varying sizes and shapes. Depending on the chosen dimensions, the hole pattern 228 may be square or rectangular. The area of the border 225 may also determine the dimensions of the hole pattern 228.

FIGS. 2 and 3 are inverted illustrations with regard to FIG. 1 of the connectors 220, cables 230, and other components of the present general inventive concept. A plurality of the cables 230 may be coupled to the connector 220. The holes 221 of the connector 220 and the cables 230 may be selectively coupled to each other by coupling units 240 (illustrated in FIGS. 4-6).

Referring to FIG. 4, also inverted with respect to FIG. 1, each of the coupling units 240 can include a conductive protrusion 244 disposed in the hole 221, a support body 243 connected to the conductive protrusion 244, extending from a periphery of the hole 221 by a certain length, a pair of curved, or rounded bodies 241 extending by a certain length from inside the support body 243 to face each other, and a pair of hook bodies 242 installed at a first end 230a of the cable 230, inserted between the pair of curved bodies 241, and bent in a hook shape to be hooked inside the pair of curved bodies 241. The hook bodies 242 may be wires made of copper, gold, aluminum, alloys thereof, and other metals as are known in the art.

The support body 243 may include two symmetric portions 243a and 243b disposed between the pair of curved bodies 241, the connectors 220 and conductive protrusion 244. The two symmetric portions 243a and 243b may each have convex rounded portions that join together to form a rounded V-shape. Through the rounded V-shape, the support body 243 may receive conductive components, such as the pair of curved bodies 241 illustrated in FIGS. 4-6.

The support body 243 and the curved bodies 241 may be electrically connected to each other, and the support body 243 may be electrically connected to a contact terminal 91 of the semiconductor chip 90 through the conductive protrusion 244 inserted into the hole 221.

Therefore, the pair of hook bodies 242 may be introduced between the pair of curved bodies 241 into a space surrounded or partially surrounded by the V-shaped support body 243, and may contact inner surfaces of the pair of curved bodies 241. Therefore, the hook bodies 242 may be electrically connected to the support body 243 and the conductive protrusion 244.

According to the above configuration illustrated in FIGS. 4-6 which represents a plurality of holes 221 and a plurality of coupling units 240, the cables 230 may be selectively coupled to the holes 221 by the coupling units 240. Therefore, according to an example embodiment, a user or test program of a controller may selectively configure and determine specific cables from the plurality of cables 230 to connect to various holes 221 via the coupling units 240, to correspond to various layout patterns of different semiconductor chips to be tested, as well as various test algorithms of different test apparatuses. Therefore, the pattern in which the cables 230 are coupled to the holes 221 can be readily modified.

The hook bodies 242 of the cables 230 when disengaged from one or more of the plurality of holes 221 may be spaced away from and electrically disconnected from the holes 221.

Referring to FIG. 5, the pair of hook bodies 242 provided at the first ends 230a of the cables 230 may be inserted into and installed in a mounting groove 232 of the cables 230.

Referring to FIG. 6, the lower ends 242a of the pair of hook bodies 242 and the first end 230a of the cable 230 may be rotatably coupled to each other by the hinge unit 231 installed at the one end of the cable 230.

Therefore, the pair of hook bodies 242 may be rotated about the hinge unit 231 toward one side from the first end 230a of the cable 230, i.e., toward a second end 230b (or a lower end) of the cable 230. In other words, the hook bodies 242 may be folded down about the hinge unit 231 to detach electrical connection with the curved bodies 241. In addition, the hook bodies 242 may be inserted into the mounting groove 232 formed at an outer surface of one end of the cable 230.

Therefore, as the pair of hook bodies 242 are inserted into the mounting groove 232, the pair of hook bodies 242 may be spaced apart from the hole 221 to be electrically isolated therefrom.

Figure 7:
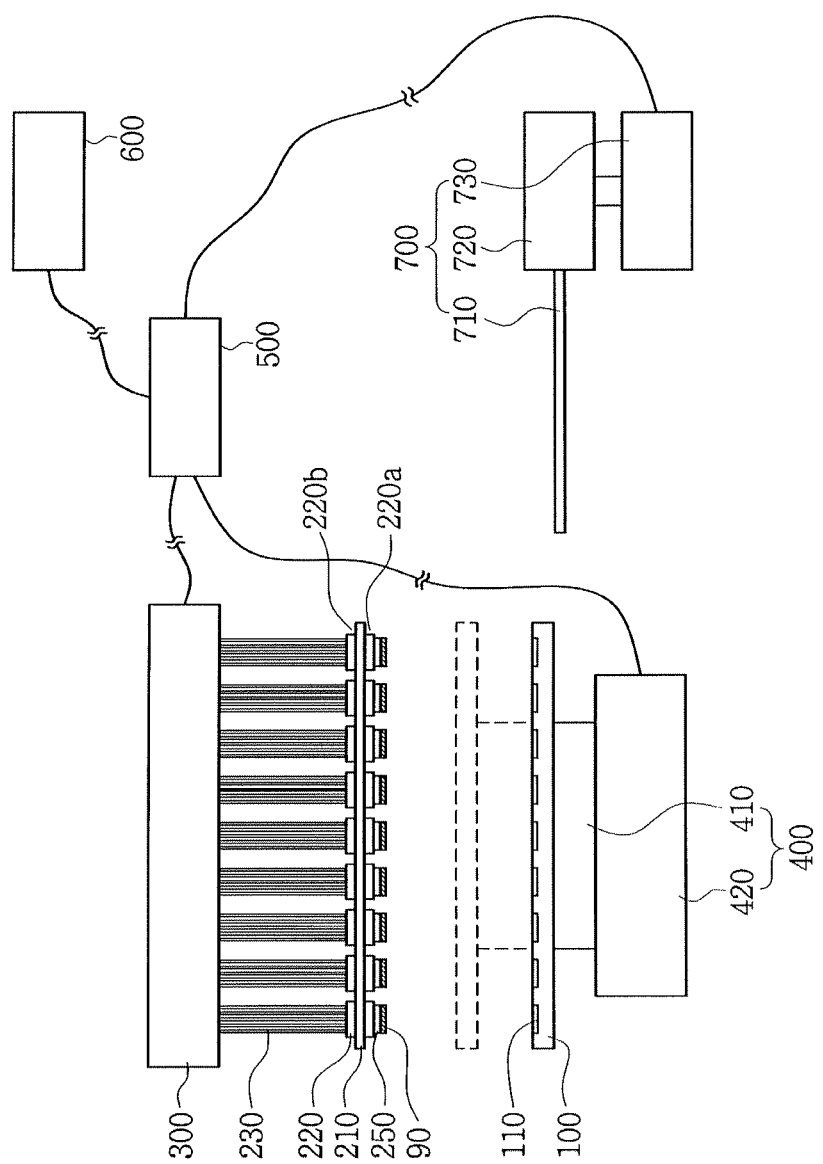
FIG. 7 is a cross-sectional view illustrating an apparatus to test a semiconductor chip in accordance with an example embodiment of the present general inventive concept.

Meanwhile, referring to FIG. 3, a socket with multiple socket components 250 (as illustrated in FIG. 7) can be installed on the connector 220 between the electrical connection terminals 91 and the connector 220 so that the semiconductor chip 90 can be fixedly inserted into the socket 250. Here, semiconductor chips 90 may have various patterns of electrical connection terminals 91. The electrical connection terminals 91 may be electrically connected to the conductive protrusions 244 inserted into the holes 221 of the connector 220 as illustrated in FIG. 4, for example.

Therefore, since the cables 230 may be selectively coupled to the holes 221 of the connector 220 by the coupling units 240, the first end 230a of the cables 230 can be coupled to the lower part 220b of the connector 220 to be readily connected to the conductive protrusions 244 connected to the connection terminals 91 of the semiconductor chip 90 having a certain pattern or pitch. The coupling units 240 thus may allow the cables 230 to be electrically connected or disconnected to the connector 220 in different configurations that correspond to different contact terminal patterns of various semiconductor chips.

As a result, the electrical connection terminals 91 of the semiconductor chip 90 may be electrically connected to the cables 230, without a conventional printed circuit board having terminals formed as a pattern of connection terminals 91.

Figure 8:
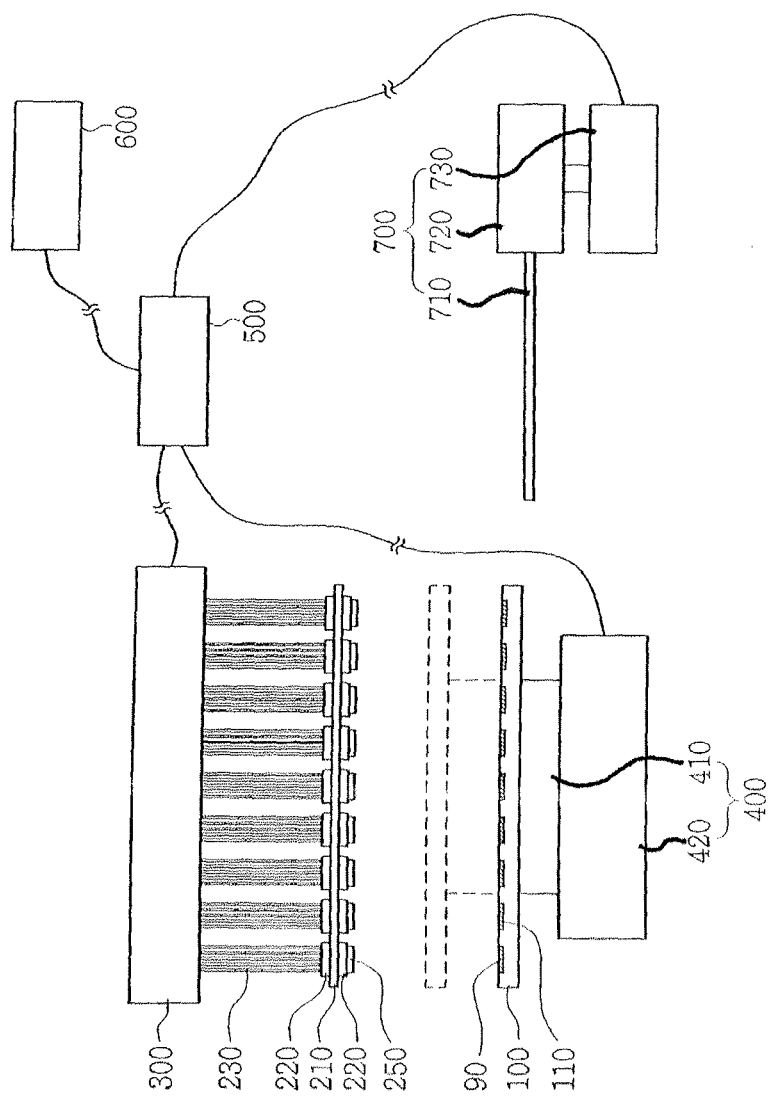
FIG. 8 is a cross-sectional view illustrating semiconductor chips being received in a tray of FIG. 7.

FIG. 7 is a cross-sectional view illustrating an apparatus to test semiconductor chips in accordance with the present general inventive concept. FIG. 8 is a cross-sectional view illustrating semiconductor chips being received in a tray 100 of FIG. 7.

Hereinafter, an apparatus to test semiconductor chips utilizing the connecting unit will be described.

Referring to FIGS. 7 and 8, a semiconductor chip test apparatus in accordance with the present general inventive concept can include a tray 100, a connecting unit 200 disposed over the tray 100, a tester 300 electrically connected to the connecting unit 200, a lifter 400 configured to raise and lower the tray 100, a loader/unloader 700 configured to load or unload the tray 100 to a certain position, and a controller 500 configured to operate the tester 300, the lifter 400, a display device 600, and the loader/unloader 700, wherein the loader/unloader 700 and the display device 600 are operated depending on test results from the tester 300.

The tray 100 can have a plurality of receiving grooves 110. The receiving grooves 110 can be formed in the tray 100 to correspond to positions of the holes 221 disposed in a lattice, or grid shape as illustrated in FIG. 2.

Here, the receiving grooves 110 of the tray 100 may be opened upward.

As illustrated in FIG. 8, the tray 100 may include a plurality of receiving grooves 110 to receive a plurality of semiconductor chips 90. The top surface of the chips 90 can be planar, or on the same level as the top surface of the tray 100.

The connecting unit 200 can be disposed over the tray 100. The connecting 200 may include the cables 230, the coupling units 240, the connectors 220, the connector fixing plate 210 and the sockets 250. Since the connection unit 200 has substantially the same constitution as described with reference to FIGS. 1 to 6, detailed description thereof will not be repeated.

Therefore, the surfaces or portions 220a of the connectors 220 of the connecting unit 200 can be disposed to face the tray 100, as illustrated in FIG. 7. As a result, the connectors 220 can be disposed to correspond to the tray 100, and the holes 221 of the connectors 220 can be disposed to correspond to the receiving grooves 110.

Semiconductor chips 90 having various patterns of electrical connection terminals 91 may be fixed to the connectors 220. The semiconductor chips 90 can be fixed to the connectors by the sockets 250 coupled to upper surfaces 220a of the connectors 220.

The cables 230 can be installed at rear surfaces 220b of the connectors 220 to be selectively electrically connected to the conductive protrusions 244 disposed in the holes 221 through the coupling units 240. The cables 230 may be installed at the rear surfaces 220b of the connectors 220 through the coupling units 240 to correspond to various patterns of the electrical connection terminals 91 of the semiconductor chips 90.

The other, or tester ends 230b of the cables 230 can be electrically connected to the tester 300 configured to receive electrical signals from the semiconductor chips 90 and perform electrical tests.

The tester 300 may transmit electrical test signals to the semiconductor chips 90 through the cables 230, and receive electrical signals transmitted from the semiconductor chips 90 in response to the electrical test signals.

The tester 300 may be electrically connected to the controller 500.

The lifter 400 can be disposed under the tray 100 to raise or lower the tray 100 to various positions as illustrated by the dotted lines above the tray 100 in FIG. 7. The lifter 400 may include a cylinder body 420, and a cylinder shaft 410 connected to the cylinder body 420 to be extended or contracted. Therefore, the cylinder body 420 may be electrically connected to the controller 500 to receive an electrical signal from the controller 500 to raise or lower the cylinder shaft 410. The lifter 400 may operate the cylinder shaft 410 using a pneumatic pressure, hydraulic pressure, or other mechanical operation.

In addition, the loader/unloader 700 unit can be installed adjacent to the tray 100. The loader/unloader 700 may receive an electrical signal from the controller 500 to load the tray 100 onto the lifter 400 or unload the tray 100, in which the semiconductor chips 90 and other components are received, to a certain position from the lifter 400.

The controller 500 can be electrically connected to the tester 300, the lifter 400 and the loader/unloader 700. The controller 500 may operate based on pre-programmed testing algorithms stored in memory or by commands input by a user.

The controller 500 may receive an electrical test result from the tester 300 to unload the tray 100 to a normal, or first position using the loader/unloader 700 when the electrical test result is higher than a predetermined reference level, or unload the tray 100 to an abnormal, or second position, different from the first position, using the loader/unloader 700 when the electrical test result is lower than the predetermined reference level.

Hereinafter, operations and effects of the connecting unit 200 to test semiconductor chips and the apparatus to test a semiconductor chips having the same in accordance with the inventive concept will be described.

Manufactured semiconductor chips 90 may have various patterns of electrical connection terminals 91.

When the cables 230 are connected to the connector 220, the coupling units 240 including the conductive protrusions 244 may be inserted into the holes 221. Thus, the semiconductor chips 90 may be fixed, or electrically connected to the connectors 220 as illustrated in FIGS. 4-6. The semiconductor chips 90 may be fixed to upper surfaces 220a (see FIG. 7) of the connectors 220 by the sockets 250. Therefore, the electrical connection terminals 91 of the semiconductor chips 90 can be electrically connected to the conductive protrusions 244 disposed in the holes 221 of the connectors 220.

In addition, in order to electrically connect the tester 300 and the electrical connection terminals 91 of the semiconductor chips 90, first ends 230a of the cables 230 can be electrically connected to the conductive protrusions 244 disposed in the holes 221 of the connectors 220 so that the cables 230 can be mated with the patterns of the connection terminals 91.

The controller 500 may control and determine connection schemes, or selective coupling of the cables 230 to be electrically connected to the conductive protrusions 244 by the coupling units 240 in accordance with the present general inventive concept.

That is, the cables 230 may be selectively coupled to the conductive protrusions 244 disposed in the holes 221 of the connectors 220 by the coupling units 240. The coupling units 240 can allow the cables to be electrically connected or disconnected by the controller depending on a pattern of connection terminals 91 of the semiconductor chips 90.

Therefore, the cables 230 may be readily electrically connected to the connection terminals 91 of the semiconductor chips 90 disposed on the connectors 220 that can have a certain pattern or pitch.

As a result, the electrical connection terminals 91 of the semiconductor chips 90 may be electrically connected to the cables 230, without a conventional printed circuit board having terminals formed as a pattern of connection terminals. Therefore, without an intervening printed circuit board, the connection between the cables 230 and the connection terminals 91 of the semiconductor chips 90 may be labeled a direct connection, or a direct electrical connection.

Once the cables 230 are connected to the connection terminals 91 of the semiconductor chips 90, the controller 500 may direct at least one of the cables 230 to be electrically disconnected from the tester 300 depending on a pattern of the connection terminals 91 of the semiconductor chips 90. That is, one end of the one or more disconnected cables 230 may be disconnected from the holes 221 of the connectors 220.

Here, methods of disconnecting ends of the cables 230 may be classified into different types.

In an example embodiment, as illustrated in FIGS. 4-6, hook bodies 242 of the cables 230 can be separated from the curved, or rounded bodies 241, whereby the cables 230 can be disconnected from the connectors 220.

In another example embodiment, the hook bodies 242 of the cables 230 can be separated from the curved bodies 241, whereby the hook bodies 242 can be rotated using the hinge units 231 provided at the first ends 230a of the cables 230 to be inserted into the mounting grooves 232 formed at one sides of the first ends 230a of the cables, without separating the cables 230 from the connectors 220.

That is, the lower ends 242a of the pair of hook bodies 242 and the first end 230a of the cable can be rotatably coupled to each other by the hinge unit 231 installed at the first end 230a of the cable 230. Therefore, the pair of hook bodies 242 may be rotated from the first end of 230a the cable 230 to the other side, for example, rotated toward a second end 230b (or a lower end) of the cable 230. In addition, the rotated hook bodies 242 may be inserted into the mounting grooves 232 formed in an outer surface of the first end 230a of the cable 230. The controller 500 controls the operation of the hinge unit 231 and the hook bodies 242 to determine when and which of the cables 230 will be electrically connected or disconnected via the coupling units 240.

As a result, the pair of hook bodies 242 can be inserted into the mounting groove 232 so that the pair of hook bodies 242 can be spaced apart from the hole 221 to be electrically disconnected therefrom.

When the connection terminals 91 of the semiconductor chips 90 that are fixed, or electrically connected to the connectors 220 are electrically connected to the tester 300 through the cables 230, the tray 100 can be positioned under the connectors 220 as illustrated in FIG. 7. The receiving grooves 110 of the tray 100 can be disposed to correspond to the semiconductor chips 90 fixed to the connectors 220. In addition, a lower part of the tray 100 can be supported by the lifter 400.

The tester 300 may transmit electrical test signals to the semiconductor chips 90 through the cables 230, respectively, and receive return electrical signals from the semiconductor chips 90 in response to the transmitted test signals.

In addition, the tester 300 can transmit electrical test results of the semiconductor chips 90 to the controller 500.

The controller 500 can raise the tray 100 using the lifter 400 when the test results are higher than a predetermined reference level. Therefore, the tray 100 may be closely adhered to the connector fixing plate 210. The semiconductor chips 90 fixed, or electrically connected to the connectors 220, sockets 250, and portions 220a of the connectors may be inserted into the receiving grooves 110 formed in the tray 100.

After a specified number of chips 90 is tested, the semiconductor chips may be separated from the sockets 250 and the controller 500 may lower the tray 100 using the lifter 400 to a position at which the tray 100 and the connector fixing plate 210 are spaced apart from each other.

The tested semiconductor chips 90 can be received in the receiving grooves 110 of the tray 100.

The controller 500 may unload the tray 100 to a first position using the loader/unloader 700.

Also, the controller 500 can raise the tray 100 using the lifter 400 in the same manner as described above when the electrical test results are lower than a predetermined reference level. Also, a second, or subsequent number of tests may be performed on the semiconductor chips to determine a number of other characteristics desired of the semiconductor chips. In this manner, the tray 100 may be closely adhered to the connector fixing plate 210. Here, the semiconductor chips 90 fixed, or electrically connected to the connectors 220 may be inserted into the receiving grooves 110 formed in the tray 100.

The controller 500 can lower the tray using the lifter 400 to a position at which the tray 100 and the connector fixing plate 210 are spaced apart from each other, separating the semiconductor chips 90 from the sockets 250, if that configuration is used, for example. The sockets 250 may be loosened and tightened, open and closed at the direction of the controller 500 to attach and release the semiconductor chips 90 to and from the connectors 220.

The tested semiconductor chips 90 can be received in the receiving grooves 110 of the tray 100.

The tray 100 may be unloaded to an abnormal, or second position using the loader/unloader 700.

In addition, the controller 500 may be electrically connected to a display device 600. The display device 600 can be located in the vicinity of the testing apparatus or may be located remotely. Thus, the controller 500 may visually display the receiving positions at the tray of one or more failed semiconductor chips 90 in which the electrical test results are lower than a predetermined reference level. The receiving positions, or grooves 110 at the tray 100 of the semiconductor chips 90 may be displayed through a display method such as coordinate values or matrix values in the display device 600.

Therefore, an operator may immediately recognize the receiving positions of the failed semiconductor chips 90.

According to example embodiments, cables can be selectively coupled to electrical connection terminals to perform electrical tests depending on various patterns of the electrical connection terminals of semiconductor chips in that a separate printed circuit board configured to electrically connect the electrical connection terminals of the semiconductor chip can be excluded. As a result, the semiconductor chip can be directly connected to the cables to improve accuracy of electrical tests.

In addition, the semiconductor chips for which electrical tests have been completed can be simultaneously received in a tray.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of the present general inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A connecting unit to test a semiconductor chip, comprising:
    a plurality of connectors having a plurality of holes, and on which a semiconductor chip having a certain pattern of electrical connection terminals is mounted;
    cables configured to electrically connect the electrical connection terminals to an exterior of the connecting unit; and
    coupling units configured to selectively electrically connect the cables to the electrical connection terminals through the plurality of holes the coupling units including:
        a conductive protrusion disposed in one of the plurality of holes;
        a support body connected to the conductive protrusion, extending from a periphery of the hole by a certain length;
        a pair of curved bodies configured to extend by a certain length from inside the support body to face each other; and
        a pair of hook bodies installed at a first end of the cable, inserted between the pair of curved bodies, and bent in a hook shape to be hooked inside the pair of curved bodies.

2. The connecting unit according to claim 1, further comprising:
    a hinge unit installed adjacent the first end of each cable to rotatably couple the pair of hook bodies to each cable, and
    a mounting groove disposed at the first end of each cable in which the pair of hook bodies can be inserted and mounted.

3. The connecting unit according to claim 1, wherein a plurality of socket components are installed on one surface of each connector to fix the semiconductor chip and mount the semiconductor chip on the one surface of each connector.

4. The connecting unit according to claim 1, wherein the support body comprises two symmetric portions disposed between the pair of curved bodies and the conductive protrusion.

5. The connecting unit according to claim 4, wherein the two symmetric portions form a V-shaped support body.

6. An apparatus to test a semiconductor chip, comprising:
    a tray having a plurality of receiving grooves;
    a connecting unit disposed over the tray and configured to selectively electrically connect electrical connection terminals formed on a plurality of semiconductor chips to an exterior of the connecting unit depending on a pattern of the electrical connection terminals disposed to correspond to positions of the receiving grooves;
    a tester electrically connected to the connecting unit and configured to receive an electrical signal from the semiconductor chips to perform at least one electrical test;
    a lifter configured to raise the tray to receive the semiconductor chips in the receiving grooves;
    a loader/unloader disposed adjacent to the tray and configured to load the tray onto the lifter, or unload the tray when the tray is positioned by the loader/unloader opposite the connecting unit so as to receive the semiconductor chips with the plurality of receiving grooves, to a position spaced apart a certain distance from the lifter; and
    a controller electrically connected to the tester, the lifter and the loader/unloader, configured to receive the electrical test result from the tester, and configured to unload the tray to a normal position using the loader/unloader when the electrical test result is higher than a predetermined reference level and unload the tray to an abnormal position using the loader/unloader when the electrical test result is lower than the predetermined reference level.

7. The apparatus according to claim 6, wherein the connecting unit comprises:
    a connector fixing plate;
    a plurality of connectors installed at a plurality of positions of the connector fixing plate to expose upper and lower parts thereof to an exterior of the connecting unit, having a plurality of holes formed therein, and on which a semiconductor chip having a certain pattern of electrical connection terminals is mounted;
    cables configured to electrically connect the electrical connection terminals to the exterior; and
    coupling units configured to selectively connect the cables to the electrical connection terminals through the plurality of holes.

8. The apparatus according to claim 6, wherein each of the coupling units comprises:
    a conductive protrusion disposed in one of the plurality of holes;
    a support body connected to the conductive protrusion, extending from a periphery of the hole by a certain length and including a plurality of symmetric portions spaced apart from each other;
    a pair of curved bodies configured to extend by a certain length from inside the support body to face each other; and
    a pair of hook bodies installed at a first end of the cable, inserted between the pair of curved bodies, and bent in a hook shape to be hooked inside the pair of curved bodies.

9. The apparatus according to claim 7, further comprising:
    a hinge unit installed adjacent the first end of each cable to rotatably couple the pair of hook bodies to each cable, and
    a mounting groove disposed at the first end of each cable in which the pair of hook bodies can be inserted and mounted.

10. The apparatus according to claim 7, wherein a plurality of socket components are installed on one surface of each connector to fix the semiconductor chip and mount the semiconductor chip on the one surface of each connector.

11. An apparatus to test a semiconductor chip, comprising:
    a connector fixing plate with at least one installation hole, the connector fixing plate having a first side and a second side;
    at least one connector disposed on both the first side and the second side of the connector fixing plate;
    a semiconductor chip having at least one contact terminal connected to the connector on the first of the connector fixing plate;

a plurality of cables connected to the connector on the second side of the connector fixing plate;

a tester connected to the plurality of cables to send at least one electrical signal to the at least one contact terminal to obtain test results regarding the semiconductor chip; and a coupling unit disposed between the plurality of cables and the at least one contact terminal to electrically connect the tester to the semiconductor chip, the coupling unit including:

a conductive protrusion to directly connect to the at least one contact terminal;

a support body adjacent the conductive protrusion;

a plurality of curved bodies formed adjacent the support body and having a plurality of hook bodies disposed therein and electrically connected thereto, wherein the coupling unit electrically connects at least one cable to the semiconductor chip.

12. The apparatus of claim 11, further comprising:

a tray having a plurality of receiving grooves to receive the semiconductor chip;

a lifter to raise the tray to receive the semiconductor chip from the at least one connector when the tray is positioned by the lifter to be opposite the connector;

a loader/unloader disposed adjacent to the lifter; and a controller to control the tester, lifter and loader to test the semiconductor chip, compare the test results with a predetermined reference level and to move the semiconductor chip to one of a plurality of positions based on the compared test results.

13. The apparatus of claim 11, wherein a controller controls connection and disconnection of the plurality of the coupling units to the plurality of cables.

\* \* \* \* \*